United States Patent
Govil

(12) 
(10) Patent No.: US 7,265,815 B2
(45) Date of Patent: Sep. 4, 2007

(54) SYSTEM AND METHOD UTILIZING AN ILLUMINATION BEAM ADJUSTING SYSTEM

(75) Inventor: Pradeep K. Govil, Norwalk, CT (US)

(73) Assignee: ASML Holding N.V., Veldhoven (NL)

( * ) Notice: Subject to any disclaimer, the term of this patent is extended or adjusted under 35 U.S.C. 154(b) by 107 days.

(21) Appl. No.: 11/132,194

(22) Filed: May 19, 2005

(65) Prior Publication Data

US 2006/0262288 A1    Nov. 23, 2006

(51) Int. Cl.
  *G03B 27/54* (2006.01)
  *G03B 27/42* (2006.01)
  *G03B 27/52* (2006.01)
  *G03B 27/80* (2006.01)
  *G03B 3/12* (2006.01)

(52) U.S. Cl. .......................... 355/67; 355/53; 355/55; 355/68; 359/667

(58) Field of Classification Search ................. 355/30, 355/53, 67, 55, 68; 359/509, 665, 667; 362/257, 362/293, 294; 353/101, 122
See application file for complete search history.

(56) References Cited

U.S. PATENT DOCUMENTS

| | | | |
|---|---|---|---|
| 4,837,794 A | 6/1989 | Riordan et al. | |
| 5,610,683 A * | 3/1997 | Takahashi | 355/53 |
| 5,883,704 A * | 3/1999 | Nishi et al. | 355/67 |
| 6,404,499 B1 | 6/2002 | Stoeldraijer et al. | |
| 6,686,989 B2 * | 2/2004 | Hagiwara et al. | 355/30 |
| 6,704,090 B2 | 3/2004 | Nishi | |
| 6,870,598 B2 * | 3/2005 | Nishi | 355/30 |
| 2005/0140957 A1 | 6/2005 | Luijkx et al. | |
| 2005/0237501 A1* | 10/2005 | Furukawa et al. | 355/30 |

FOREIGN PATENT DOCUMENTS

EP    1 524 558 A1 *   4/2005

\* cited by examiner

*Primary Examiner*—Alan Mathews
(74) *Attorney, Agent, or Firm*—Sterne, Kessler, Goldstein & Fox, P.L.L.C.

(57) ABSTRACT

A method and system are used to control a characteristic of a beam. The system comprises an illumination system, at least one optical element, a fluid source, and a pressure and/or fluid concentration controller. The illumination system produces a beam of radiation. The at least one optical element has at least one fluid path therethrough through which the beam passes and is capable of changing a characteristic of one or more portions of the beam. The fluid source supplies fluid to the at least one fluid path. The pressure and/or fluid concentration controller controls pressure and/or fluid concentration of the fluid to change the characteristic of the beam, which is positioned between the fluid source and the optical element.

18 Claims, 11 Drawing Sheets

SYSTEM AND METHOD UTILIZING AN ILLUMINATION BEAM ADJUSTING SYSTEM

BACKGROUND OF THE INVENTION

1. Field of the Invention

Figure 1:
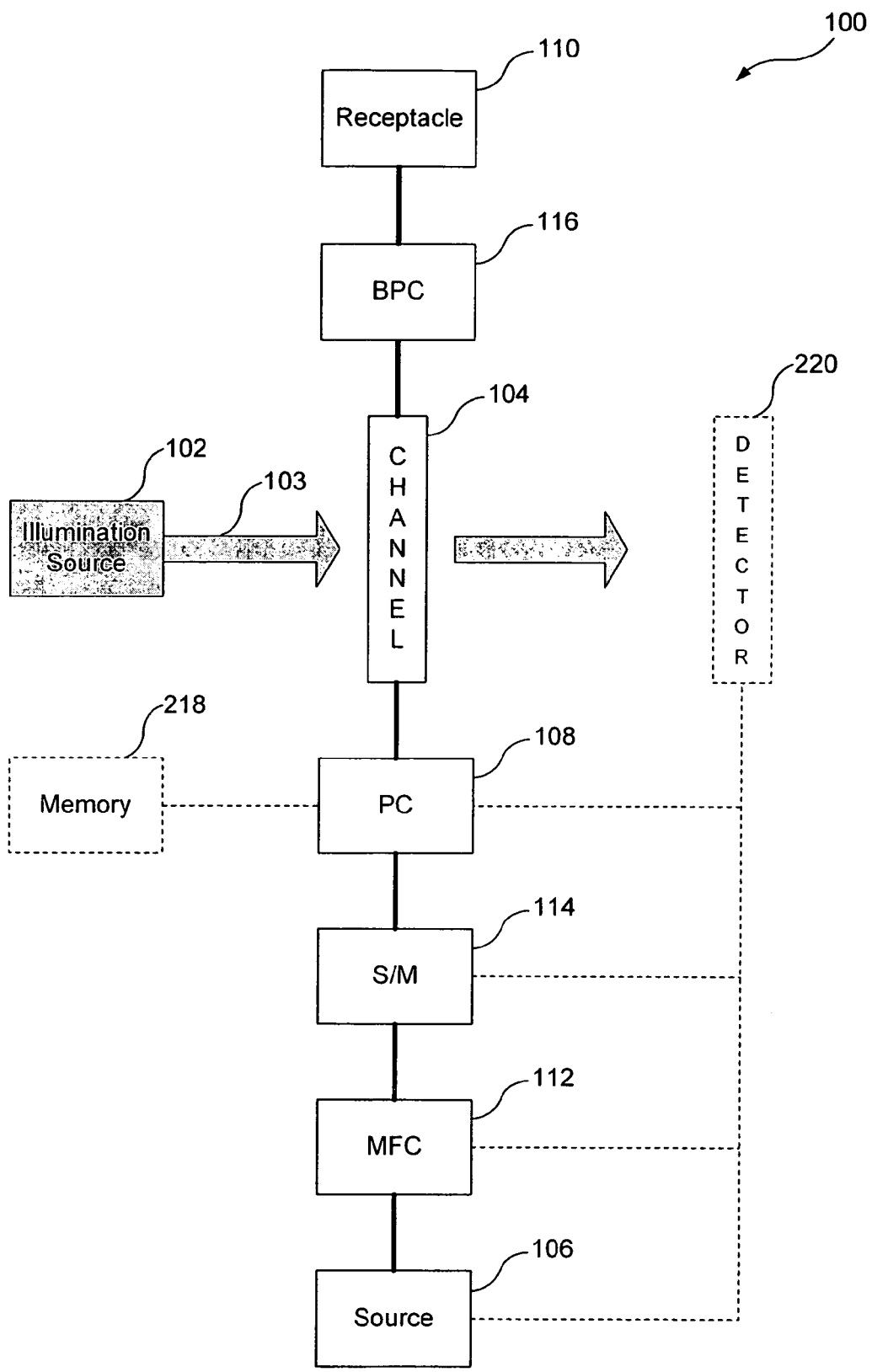

The present invention is related to illumination intensity uniformity, ellipticity and telecentricity control using radiation absorbing fluids.

2. Background Art

In a pattern generating environment that patterns an impinging beam of radiation, which is later projected onto an object, controlling characteristics of the beam and/or the patterned beam is critical. This is because the beam and/or the patterned beam have to be precisely controlled in order to form accurate patterns on the object.

Generally, patterning generating systems use static optical systems, which are typically designed and manufactured for each application of the patterning system in order to produce the light beams with desired characteristics. In the static optical system example, when a change in illumination characteristics is desired or needed, a new optical system must be designed and manufactured. Also, changing of an output of an illumination source with time cannot normally be accounted for in a static optical system, which can result in less than desirable patterns being formed on the object.

In other illumination control methods, corrections are made by throwing away light in areas with unwanted light characteristics and/or corrections are being performed by relatively slow mechanical devices, which can substantially reduce throughput.

Further, in some examples, by correcting for one optical characteristic, e.g., light intensity uniformity, other characteristics become undesirable, e.g., ellipticity and/or telecentricity.

Therefore, what is needed is a system and method utilizing a dynamic optical system that is adjustable in response to measured or detected characteristics of an illumination beam and/or patterned illumination beam.

BRIEF SUMMARY OF THE INVENTION

An embodiment of the present invention provides a system comprising an illumination system, at least one optical element, a fluid source, and at least one of a pressure controller and fluid concentration controller. The illumination system produces a beam of radiation. The at least one optical element has at least one fluid path therethrough through which the beam passes and the optical element is capable of changing a characteristic of one or more portions of the beam. The fluid source supplies fluid to the at least one fluid path. The pressure and/or fluid concentration controller controls pressure and/or fluid concentration of the fluid to change the characteristic of the beam, which is positioned between the fluid source and the optical element.

Another embodiment of the present invention provides a method, comprising the following steps. Changing a characteristic of one or more portions of a beam of radiation using at least one optical element having at least one fluid path therethrough through which the beam passes. Supplying a fluid to the at least one fluid path. Controlling a pressure and/or fluid concentration of the fluid before it enters the optical element to perform the changing step.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

FIG. 1 shows a system, according to one embodiment of the present invention.

Figure 2:
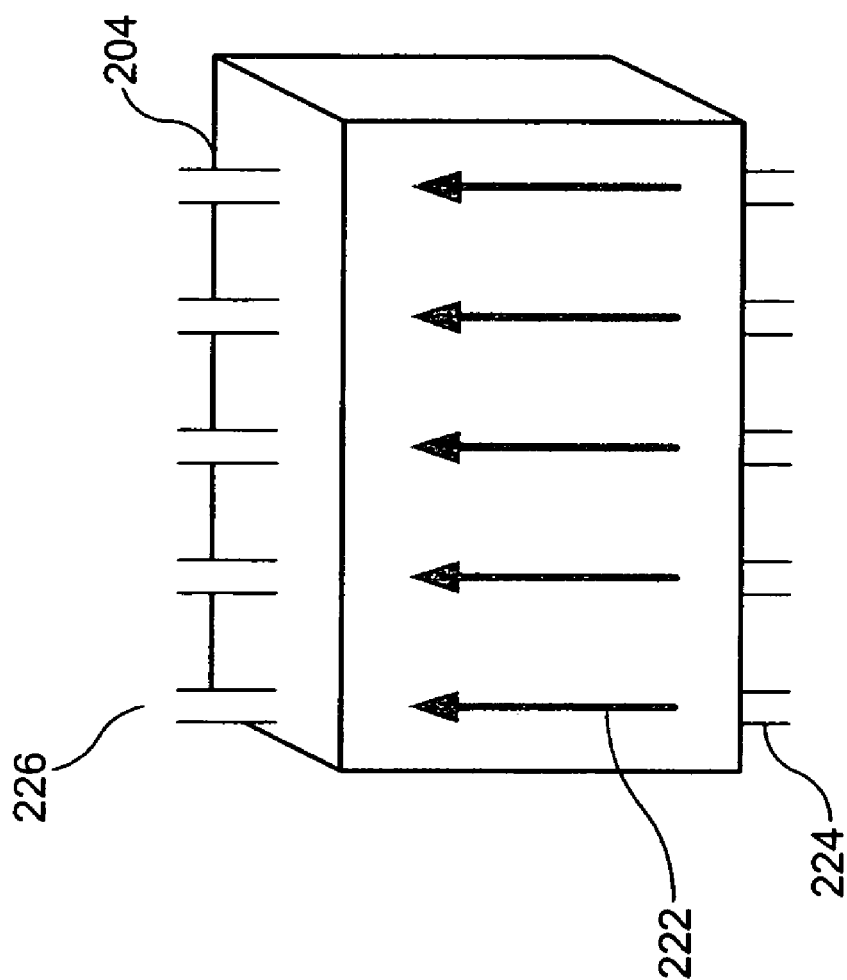
Figure 3:
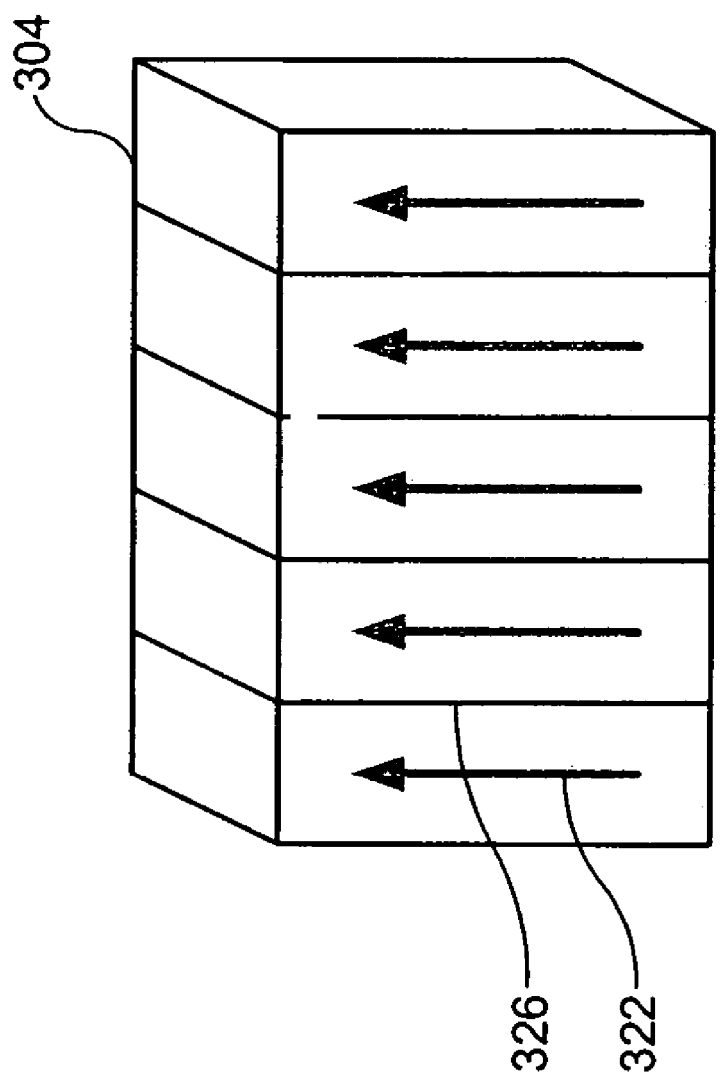
Figure 4:
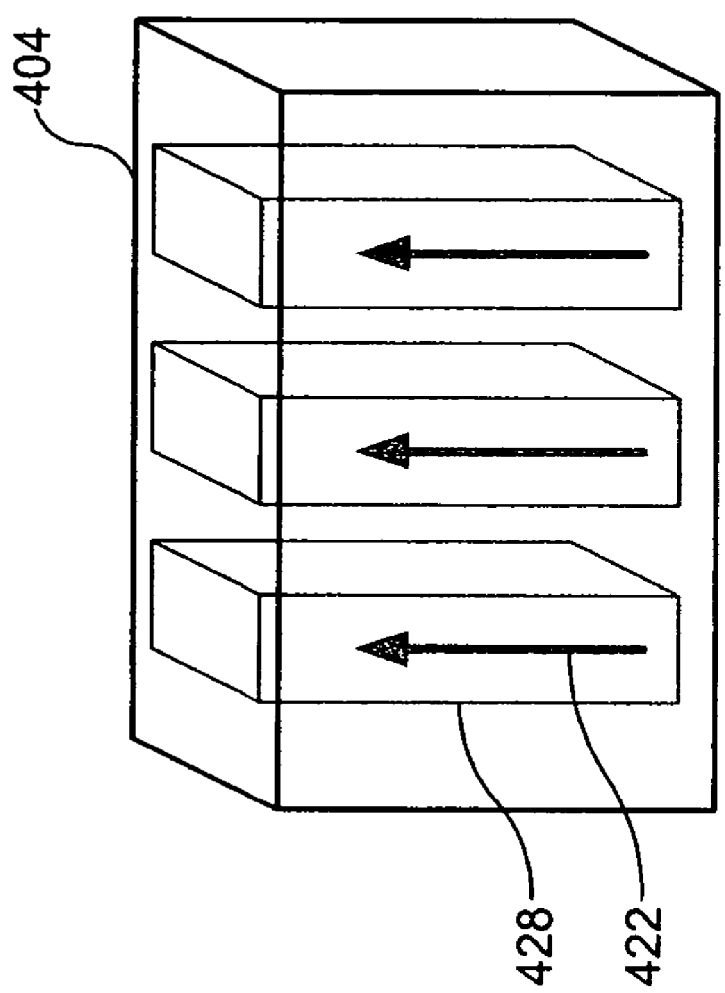

FIGS. 2, 3, and 4 show various configurations for fluid paths in an optical element, according to various embodiments of the present invention.

Figure 5:
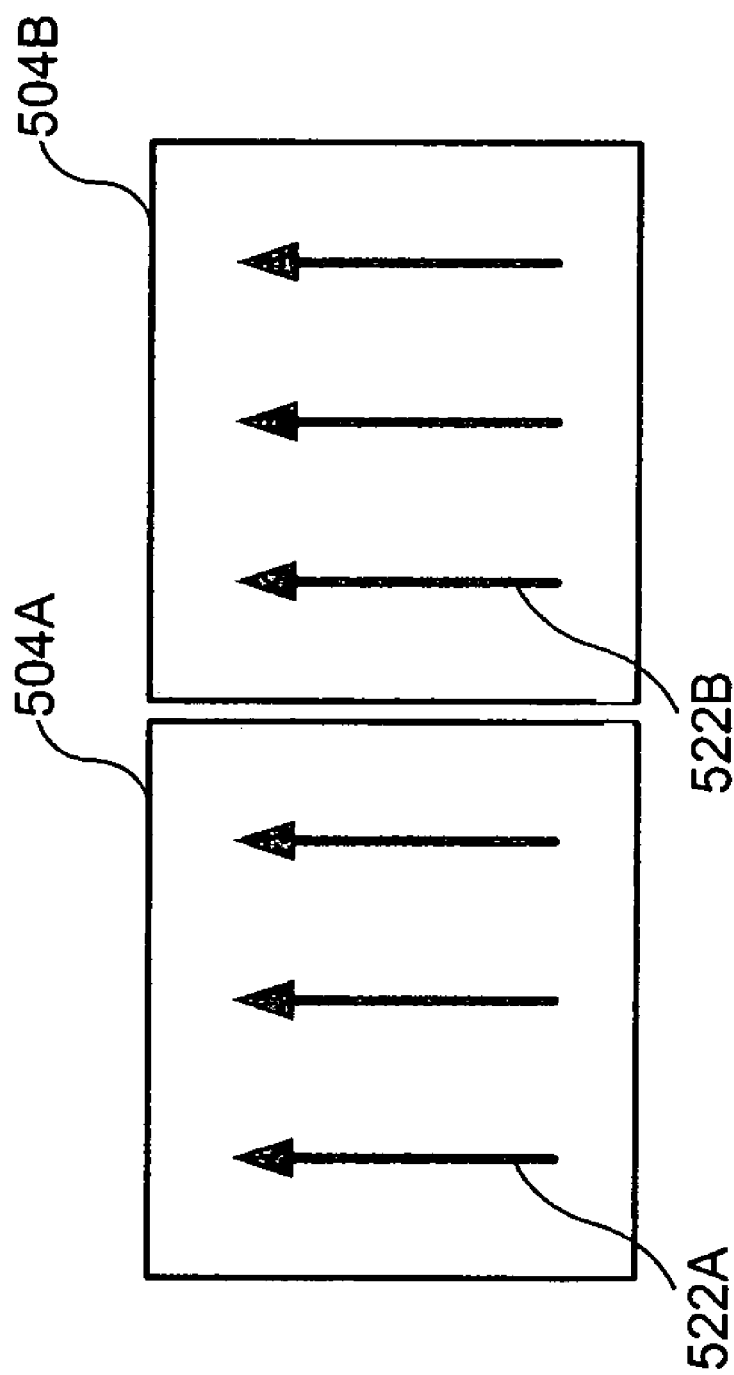
Figure 6:
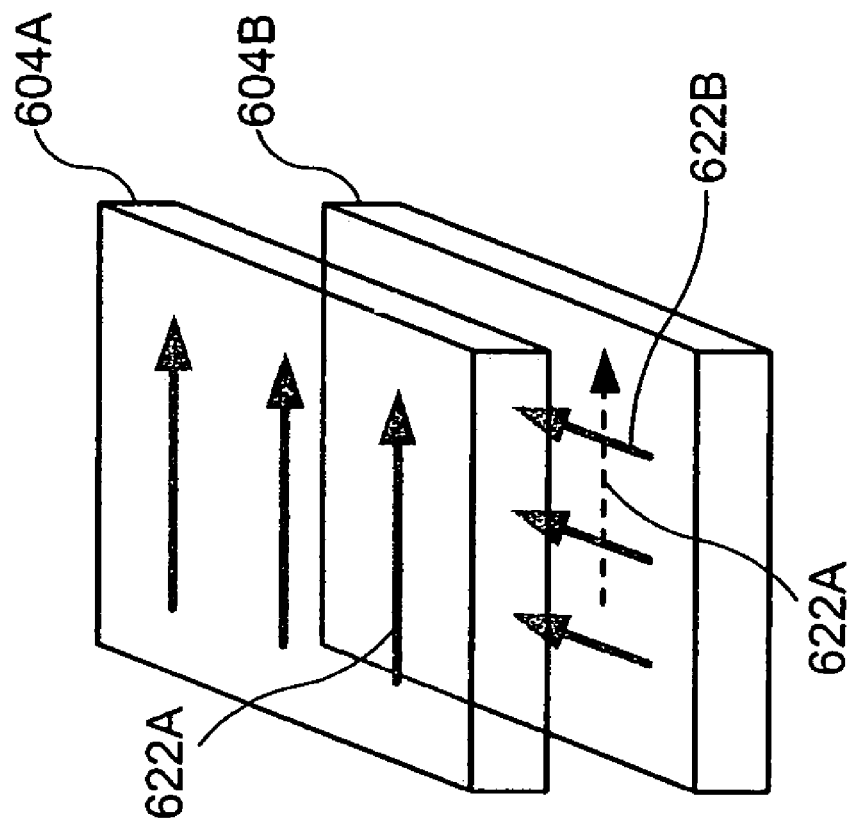
Figure 7:
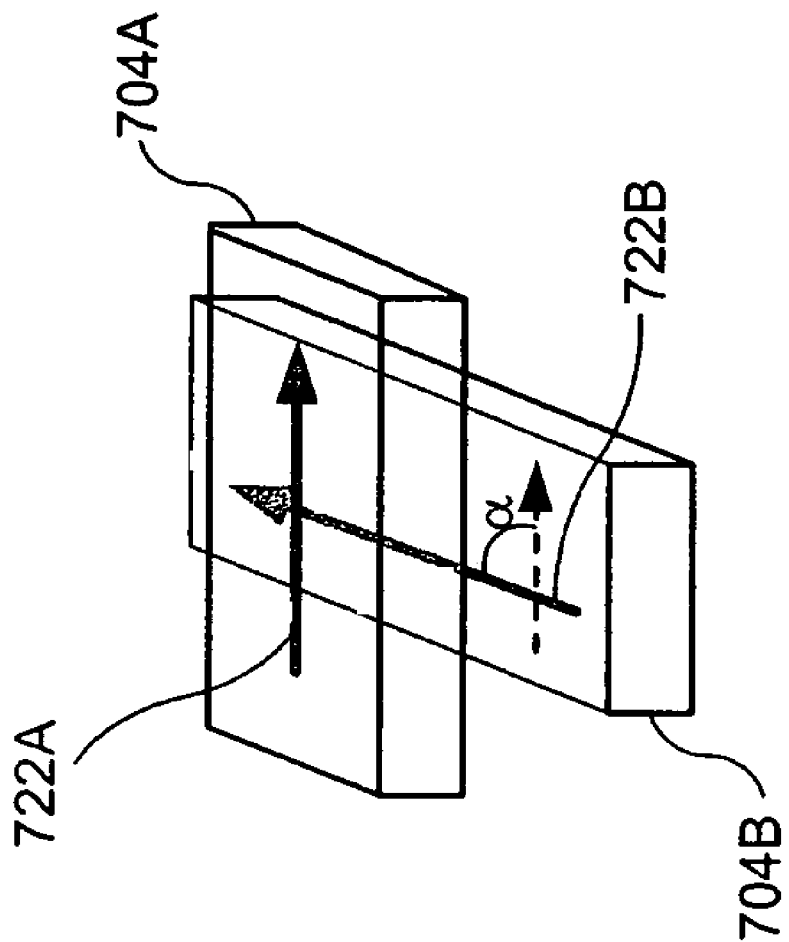

FIGS. 5, 6, and 7 show various configurations when a plurality of optical elements are used, according to various embodiments of the present invention.

Figure 8:
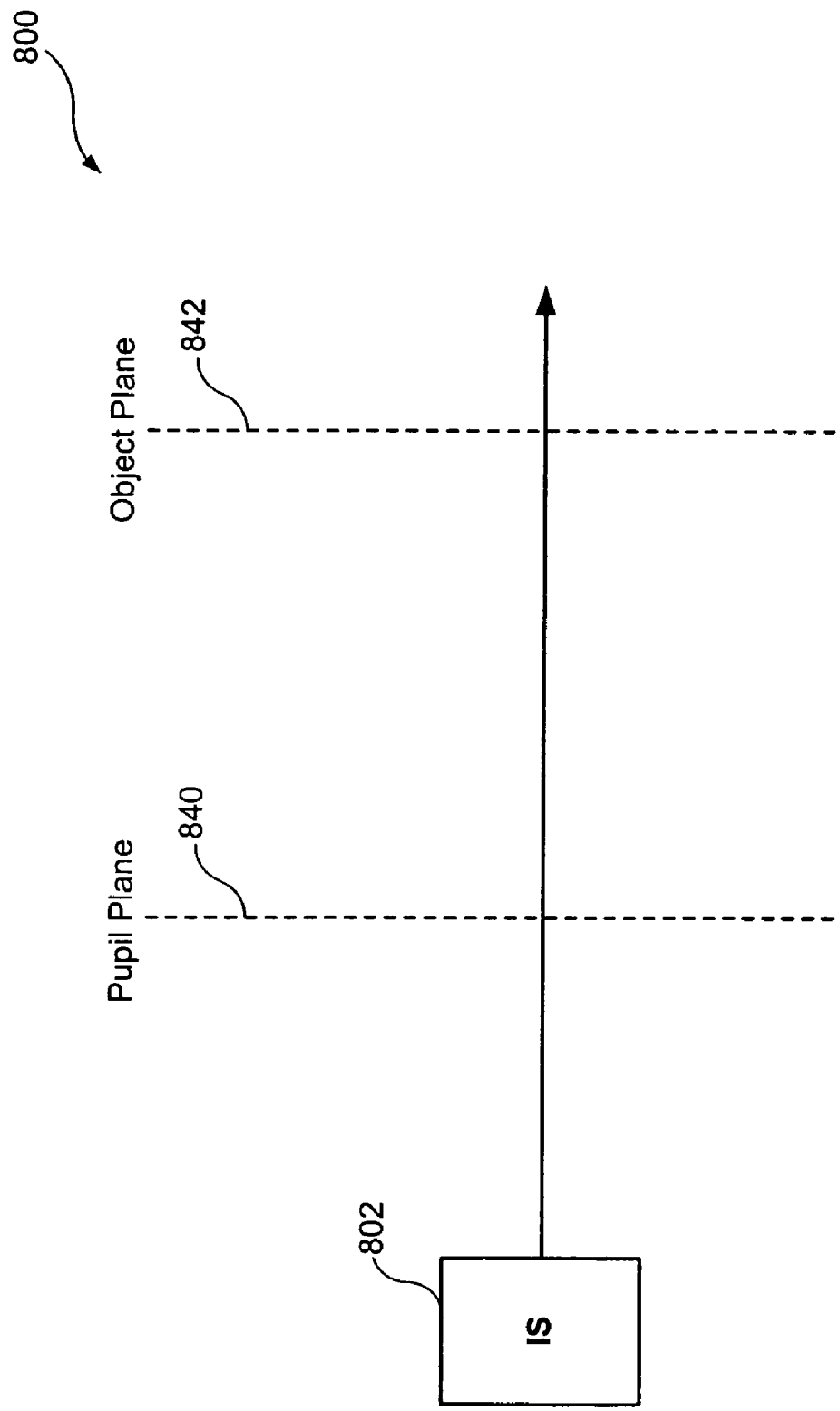

FIG. 8 shows an illumination system, according to one embodiment of the present invention.

Figure 9:
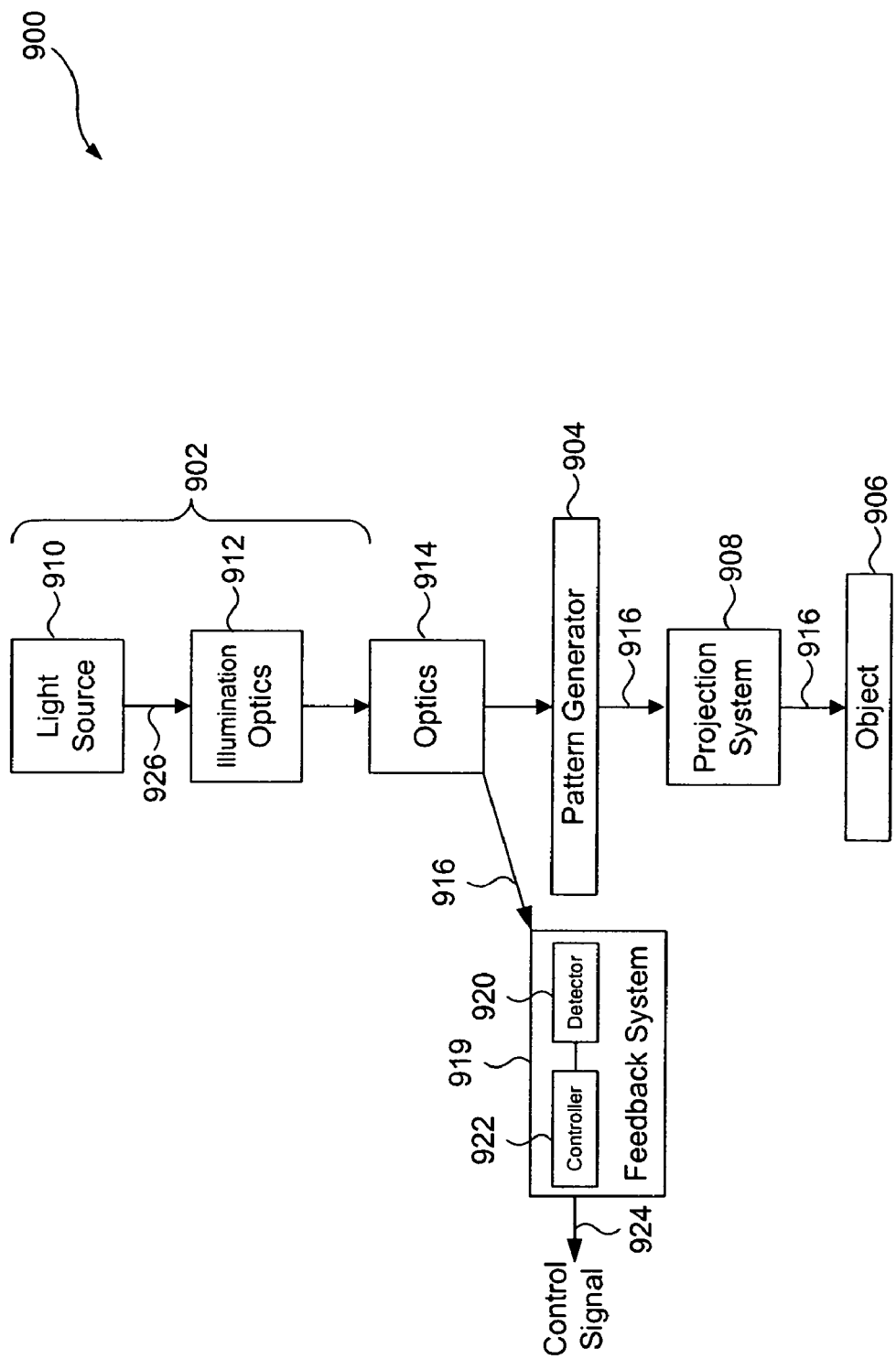
Figure 10:
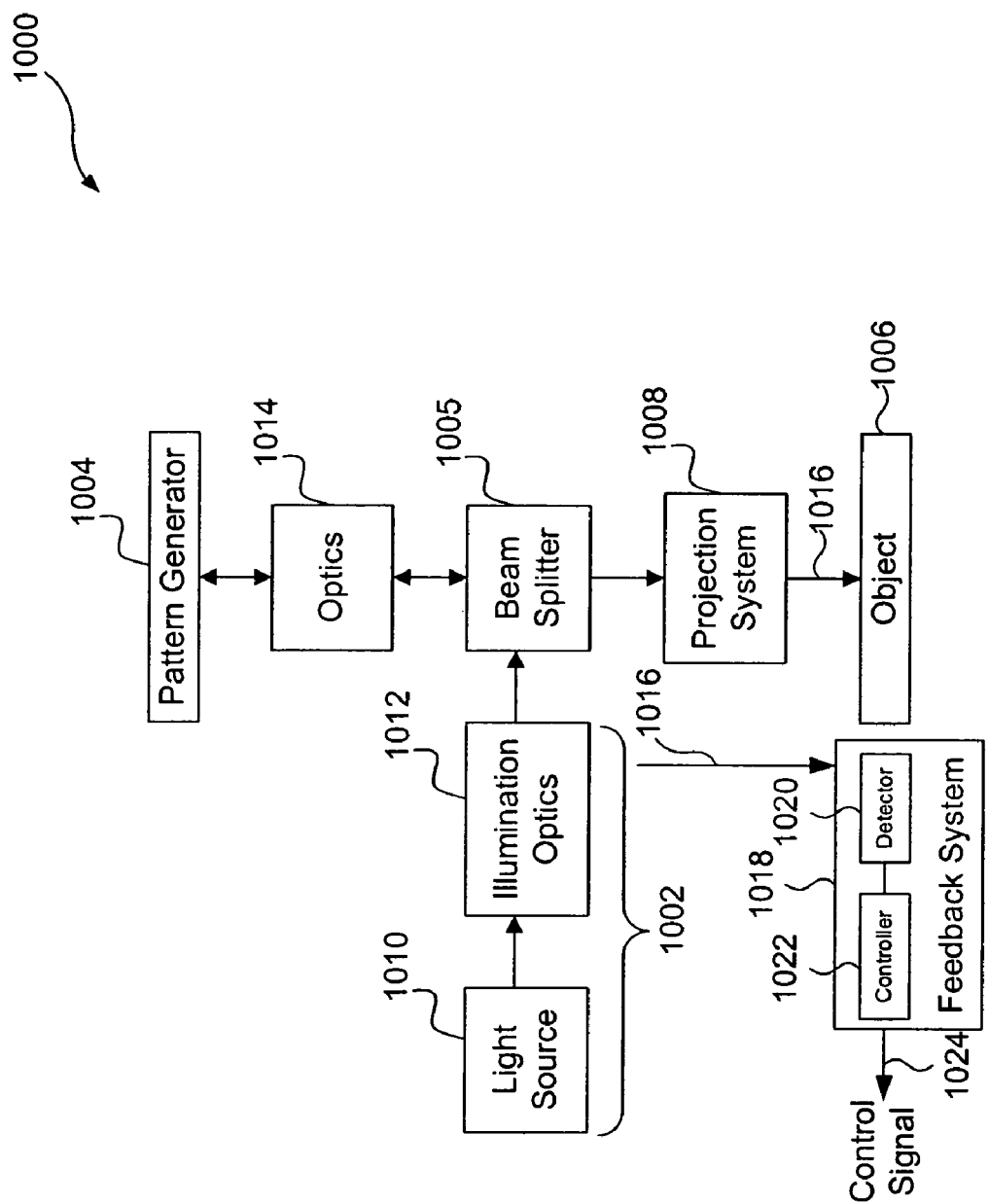
Figure 11:
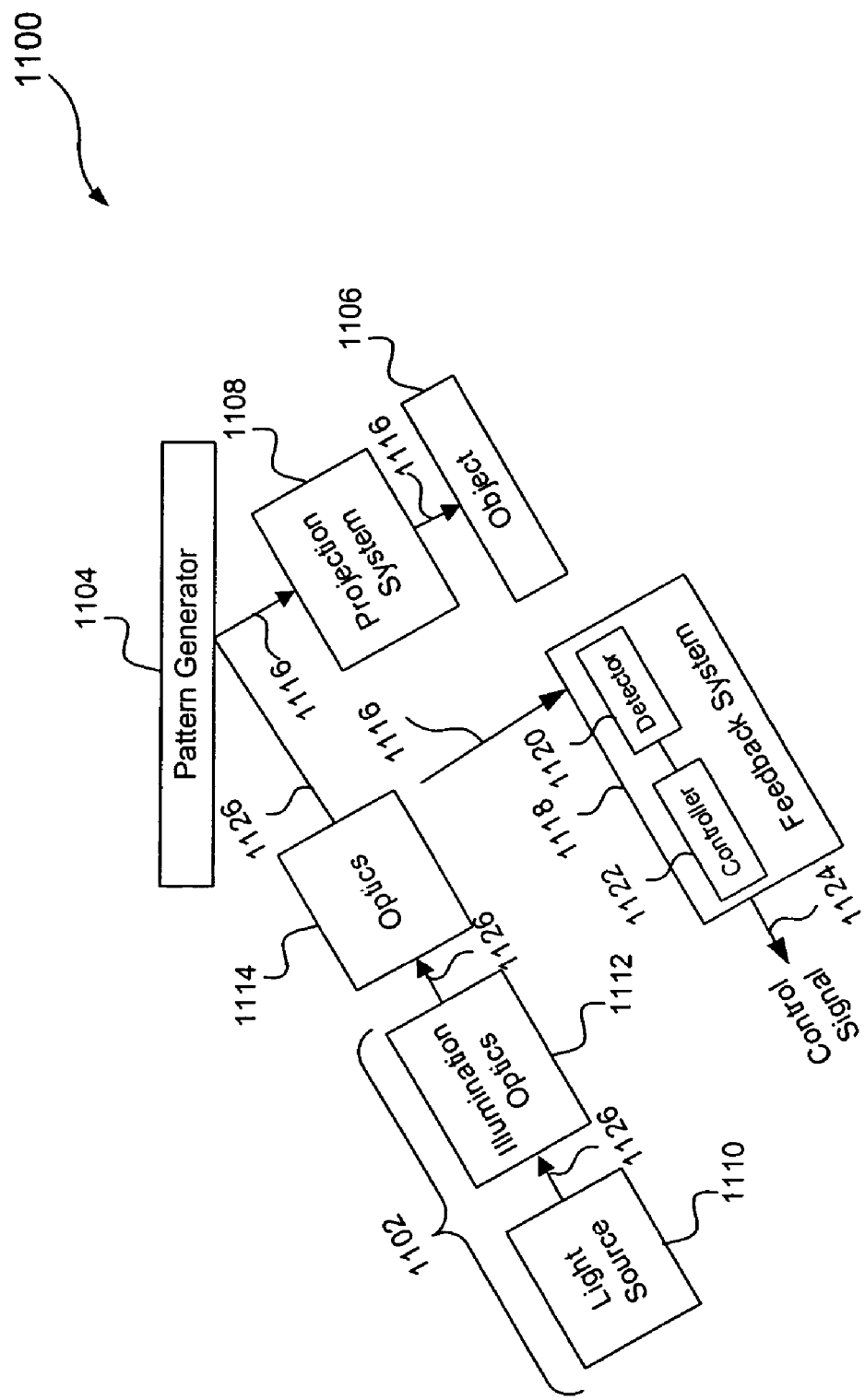

FIGS. 9, 10, and 11 shows various lithography systems, according to various embodiments of the present invention.

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION OF THE INVENTION

Overview

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Embodiments of the present invention provide a system and method utilizing an optical element having one or more fluid flow paths therethrough. As a beam of radiation from an illumination source passes through the optical element, a pressure controller and/or a concentration controller adjust parameters of the fluid flow to change characteristics of one or more portions of the beam or an entire cross-section of the beam, if necessary.

In various examples, more than one of the optical elements can be used in either adjacent or sequential relationships. Fluid flow paths can be parallel, perpendicular, and/or angled with respect to each other in each optical element when more than one is used. Fluid paths can also take any other shape, such as radial, concentric circles, or curved paths In various examples, adjustment of the fluid flow, and based thereon, the characteristics of the beam, allow for changes or correction of ellipticity, illumination intensity uniformity, and/or telecentricity of the beam or portions thereof. Beam profiles can also be modified to a desired shape.

Exemplary System

FIG. 1 shows system 100, according to one embodiment of the present invention. System 100 can be an illumination system, for example in a lithography system as described below with respect to FIGS. 9, 10, or 11. System 100 includes an illumination source 102 that produces a beam of radiation 103, which illuminates an optical element 104 having a fluid path (not shown).

Optical element 104 can be made from any material that allows transmission of a desired wavelength of beam 103 (e.g., 346 nm, 248 nm, 193 nm, etc.) at a desired transmitted percentage or desired amount of absorption. For example, optical element 104 can be a glass plate with micro-channels or with a flow through cavity.

In one example, optical element 104 is relatively bigger than a field of illumination system 100, for example, optical element 104 can be about 104 mm wide, about 60 mm long, and about 5 mm high.

The fluid path receives a fluid from a fluid source 106 under control of a pressure controller 108 (PC 108). The fluid is captured at a receptacle 110 after leaving optical element 104, after which the fluid is either disposed of or recycled.

In one example, the fluid can be, but is not limited to, a liquid or a gas that includes a carrier component (e.g., $N_2$, etc.) and an absorbing component (e.g., Ozone, NO, $NO_2$, etc.) that is based on concentration.

In another example, through adjustment of a pressure exerted on the fluid (e.g., NO, etc.) using pressure controller 108, parameters of the fluid are adjusted (e.g., a density or concentration of the fluid or absorption properties of the fluid). This is because concentration of molecules changes when change in fluid pressure is applied. Adjustment of these fluid parameters is used to adjust characteristics of beam 103, if necessary.

Depending on a location of optical element 104 in the illumination system, as is described in more detail below with respect to FIG. 8, the characteristics of beam 103 can be, but are not limited to, intensity, ellipticity, beam profile, and telecentricity.

In various examples, the fluid is also adjusted using one or more of a mass flow controller 112 (MFC), a solenoid and/or a manifold 114 (S/M), or a back pressure controller 116. MFC 112 here is used to vary the concentration of the absorbing fluid in a carrier gas, and thus change the absorbing properties of the fluid selectively in each fluid path.

Typically, S/M 114 is a pipe that has several lateral outlets to or from other pipes or a pipe or chamber having multiple apertures for making connections, e.g., when multiple fluid paths or channels are used, as discussed below. This can be filled with absorbing material at a certain pressure, e.g., a storage device. Manifold portion of S/M 114 can act as a "capacitor," so that as flow through each channel varies with different back pressures, the manifold supply pressure does not vary. This keeps density constant, while the flow is varied. If there is not sufficient storage, this can affect the pressure, i.e., density, on all the channels. Using S/M 114 allows system 100 to have separate pressure control from fluid flow control.

Typically, solenoid portion of S/M 114 is an assembly used as a switch, consisting of a coil and a metal core free to slide along the coil axis under the influence of the magnetic field. In one example, this controls back pressure controller 116.

Typically, mass flow controller 112 is an instrument installed in fluid delivery lines to control an amount of fluid delivered to a device. In another example, mass flow controller 112 can be used to adjust concentration of absorbing fluid in the carrier fluid. Mass flow controller 112 can be used to adjust the concentration of the absorbing fluid in the carrier fluid, and therefore adjust the fluid radiation absorbing properties.

Controlling a flow rate of carrier fluid can control an amount of heat, i.e., temperature rise in gas channel, which can also affect the absorption. Thus, modulation of temperature can also be used. Mass flow controller 112 controls flow rate, which controls rate of heat rise and heat dissipation. Mass flow controller 112 can be used to control concentration of absorbing gas in carrier gas.

A back pressure controller 116 is typically used to change a pressure at which a system is operating. For example, it can be used to set a base pressure. This can be set to a different value for each fluid path.

Pressure controller 108, and/or the other elements mentioned above, can be controlled using at least one or two configurations. In a first configuration, a memory 218 receives and stores information regarding optical parameters of beam 103. This information is transmitted to at least pressure controller 108 to be used during transmission of beam 103 through optical element 104 to change the characteristics of beam 103, if necessary, in whole or in part. In a second configuration, a detector 220 receives beam 103 after beam 103 has passed through optical element 104. Detector 220 detects optical characteristics of beam 103, and sends a signal correlating thereto to at least pressure controller 108. Pressure controller 108 uses this signal to adjust parameters of the fluid in order to adjust the characteristics of beam 103. For example, this can be a feedback system. It is to be appreciated that a feedforward system could also be used, in which detector 220 would be positioned before optical element 104. In one example, a processor can be added to translate the beam property information into the pressure or concentration control requirements for each channel and to calculate the delta changes needed, which in turn are communicated to the pressure and/or concentration controllers for implementation.

In one example, the fluid can contain a component used to match or substantially match optical parameters, e.g., index of refraction, of a material of optical element 104. This can be done to minimize any shadows or reflection light from fluid to optical element interfaces. This can also reduce and diffraction at a boundary.

In one example, the fluid flow absorbs energy from optical element 102 and beam 103 in order to substantially reduce or control heat effects, and therefore temperature changes, in system 104. This is desirable to maintain desired fluid density or concentration through element 104.

Exemplary Optical Elements

FIGS. 2, 3, and 4 show various configurations for fluid paths in an optical element, according to various embodiments of the present invention. These are for illustration only, and it is to be appreciated that other shapes and configurations are also possible.

FIG. 2 shows an exemplary optical element 204 with plural fluid paths 222, according to one embodiment of the present invention. A beam of radiation would impinge on optical element 204 into the page. Although only one fluid path 222 is necessary, any number can be used depending on the desired application of optical element 204.

In a one channel example, optical element 204 can act as a filter. For example, a profile of the channel can have a profile that relates to a known profile trying to correct or a profile desired to impart to a beam. Then this single channel is placed across the beam, and one channel is used. In one example, as the absorption of the fluid in the channel changes a profile of the light beam formed by the shape of the channel remains the same, while the amplitude of the light across the beam profile varies based on the absorption characteristics of the fluid, as described above.

In anther example, a plurality of very densely packed fluid paths 222 can be used, for example, but not limited to, about 10-200 µm wide each with channel depths in the range of 50 microns to hundreds of microns, to control very small portions of an illumination beam. A spacing between channels is chosen depending on a desired spatial frequency being corrected in a particular application.

In one example, fluid in each path can have a different absorption property to effect different portions of an impinging beam differently.

In one example, this can be done either through using a different fluid mixture in different fluid paths 222. For example, each fluid path 222 can have stepped absorption rates, such that each one is two-times one below it. In one example, through use of both pressure and concentration control, a relatively large range of correction capability is achieved in a fast system. This is because pressure changes very fast, while concentration changes very slow. Through using channels have different preselected concentrations of fluids, one can be selected and "fine-tuned" using pressure control.

In another example, this can be done using multiple pressure controllers, one for each fluid path 222 causing different concentrations in each fluid path 222, which causes different absorption rates of each fluid path 222.

In yet another example, this can be done using one or mode mass flow controllers.

Thus, there are at least three ways to dynamically control an optical element, pressure variation using a pressure controller, concentration variation using either multiple fluids in different paths or through other means, or a combination of pressure and concentration variation.

In the embodiment of FIG. 2, fluid paths 222 are formed through a laminar flow technique, which exerts enough pressure between input 224 and output 226 to maintain the fluid in a predefined path in the direction of the arrow. In one example, though use of multiple fluid paths 220, individual portions of an impinging beam can be adjusted separately. This can be done by using a separate pressure controller for each flow path 220 and/or having separate fluid channels from a fluid source, each having a different fluid profile therein. For example, a same carrier component of the fluid can be used with varying absorption components to vary absorption of the portions of the beam.

It is to be appreciated that, although shown as straight paths, paths 222 can take any shape, e.g., linear, curved, curvilinear, etc., based on a particular application. The shape can be dependent on what changes need to be made to an illumination beam.

In one example, instead of being parallel, paths 222 can be radially arranged in optical element 204 or arranged at other angles with respect to each other.

FIGS. 3 and 4 show optical elements 304 and 404, respectively, according to various embodiments of the present invention. Optical elements 304 and 404 are similar to optical element 204, with the following exceptions. Fluid paths 322 in optical element 304 are formed as channels using walls 326 instead of using laminar flow. Fluid paths 422 in optical element 404 are formed as channels using guides 428 instead of walls 326 or laminar flow techniques, for example as shown in U.S. Ser. No. 10/748,849, filed Dec. 31, 2003 (now U.S. Pat. No. 7,030,958), which is incorporated by reference herein in its entirety.

In these latter two embodiments shown in FIGS. 3 and 4, a shape of the channels formed with walls 326 and/or guides 428 can be varied, such that a beam of radiation passes through various shaped cross-sections. For example, channels can form linear, curved, curvilinear, circular, etc. cross-section in order to properly adjust the characteristics of the beam. As another example, channels can be sectors, annular configurations, etc.

For example, when shaped in quadrants, pies, or sections, ellipticity can be very easily controlled. In this example, each quadrant can have a separate absorption characteristics, as described above. When this is placed in a pupil plane of an illuminating system, ellipticity can be controlled.

Also, in these latter two embodiments, each of the channels can have varying thickness and depth along their length in the flow direction. For example, the channels can taper from one or both ends towards a middle of the channel (either starting narrow and getting larger or starting larger and getting narrower), can curve in and out, etc. In one example, tapering of a channel can correct of pressure drop across the channel. These different configurations allow for desired changes to the characteristics of the beam. For example, if a beam having known characteristics is being used, the optical element 304 or 404 can be specifically designed to meat those beam characteristics, while also being dynamic using a pressure controller or concentration controller to adjust for an actual characteristic detected.

Exemplary Configurations Using Multiple Optical Elements

FIGS. 5, 6, and 7 show various configurations when a plurality of optical elements are used, according to various embodiments of the present invention. In these embodiments, a beam of radiation will impinge either from above or below a respective optical element.

FIG. 5 shows first and second adjacent optical elements 504A and 504B having one or more fluid flow paths 522A and 522B, respectively, according to one embodiment of the present invention. It is to be appreciated that, although only two are shown, any number of optical elements 504 can be used. Although fluid flow paths 522A in first optical element 504A are parallel to fluid flow paths 522B in second optical element 504B, they could also be perpendicular or angled with respect to each other, depending on a desired application. In this configuration, depending on a size of a cross-section of an impinging beam with respect to each optical element 504, either the entire beam or portions thereof can be similarly or differently adjusted using fluid flow paths 522 under control of one or more pressure controllers. In addition, having multiple sets of plates can allow for fast change in the beam property being corrected by moving different sets of plates with different absorption under the beam cross-section being corrected.

FIG. 6 shows sequentially related optical elements 604A and 604B having fluid flow paths 622A and 622B, respectively, according to one embodiment of the present invention. In this embodiment, fluid flow paths 622A (shown in phantom on optical element 622B) are perpendicular with respect to fluid flow paths 622B. It is to be appreciated that in other examples the fluid flows paths could be parallel or angled with respect to each other. In this configuration, an impinging beam can be twice adjusted along the different axial orientation to twice change optical characteristics of the beam, if necessary, based on the differently situated fluid flow paths 622A and 622B.

FIG. 7 shows sequentially related optical elements 704A and 704B having fluid flow paths 722A and 722B, respectively, according to one embodiment of the present invention. In this embodiment, fluid flow paths 722A (shown in phantom on optical element 722B) are at an angle a with respect to fluid flow paths 722B though making optical elements 704A and 704B angled with respect to each other. It is to be appreciated that in other examples the fluid flows paths could be parallel or perpendicular with respect to each other. In this configuration, an impinging beam can be twice adjusted to twice change optical characteristics of the beam, if necessary, based on the differently situated fluid flow paths 722A and 722B.

In one example, an optical element according to one or more of the above embodiments and/or examples allows light to pass without any substantial effect on ellipticity or telecentricity in or along a scanning direction. In one example, telecentricity is substantially not effected because symmetrical attenuation.

In one example, FIGS. 6 and 7 allow for two-dimensional control of a light beam profile, e.g., in both X and Y directions, and other orientations, such as 45 degrees, or radial paths are also possible.

Exemplary Placement of an Optical Element in an Illumination System

FIG. 8 shows an exemplary illumination system 800, according to one embodiment of the present invention. Illumination system 800 is shown to have at least a pupil plane 840 (e.g., positioned based on a specific application), an image plane 842 (e.g., at a patterning device). Illumination system 800 can also include an object plane and/or a field plane, whose positions are application specific. In one example, a patterning device can be place at object plane 842. Depending on what change or adjustment is desired to a beam of radiation, one or more optical elements (e.g., optical element 104) can be placed at one or both of pupil plane 840 or object plane 842. For example, when ellipticity is being corrected the optical element is positioned substantially in pupil plane 840. As another example, when one or both of telecentricity or intensity uniformity are being correct, the optical element is positioned substantially in object plane 842.

In one example, an optical element is placed in a field, however if elements are located in the field it can be located in other positions. A defocused location from pupil plane can allow for both pupil and field properties simultaneously.

In one example, using an optical element according to any one of the above embodiments or examples allows placement anywhere in illumination system 100, substantially without affecting a pupil plane and only changing effects on a field plane.

In one example, because an optical element according to any of the above embodiments and examples has substantially stationary parts, in contrast to conventional devices with mechanical parts, it is more reliable.

In example, using an optical element according to any one of the above embodiments or examples allows for very rapid change in an intensity profile of a beam of light passing through the optical element, e.g., to make it uniform or a custom profile.

Exemplary Environment: Lithography

FIGS. 9, 10, and 11 show various lithography systems 900, 1000, 1100, according to various embodiments of the present invention. In these systems, radiation from an from an illumination system 902/1002/1102 including an optical element having a fluid path therein (not shown) illuminates a pattern generator 904/1004/1104 to produce patterned light, which is directed from pattern generator 904/1004/1104 towards a work piece 906/1006/1106 via a projection system 908/1008/1108.

In system 1000, light is directed to and from pattern generator 1004 via a beam splitter 1005.

In one example, illumination system light 916/1016/1116 can be received at feedback system 918/1018/1118 by a detector 920/1020/1120. A signal 922/1022/1122 representative of received illumination light 916/1016/1116 is transmitted from detector 920/1020/1120 to controller 922/1022/1122, and used to produce control signal 924/1024/1124. Control signal 924/1024/1124 can be a control signal transmitted to a pressure controller (not shown) based on an actual (measured) versus desired value for an optical characteristics, for example, intensity, uniformity, ellipticity, telecentricity, etc., as discussed above.

In various embodiments, work piece 906/1006/1106 is, but is not limited to, a substrate, a wafer, a flat panel display substrate, print head, micro or nano-fluidic devices, or the like.

As is known, illumination system 902/1002/1102 can include a light source 910/1010/1110 and illumination optics 912/1012/1112 and pattern generator can have optics 914/1014/1114. Also, one or both of these optics can include one or more optical elements (e.g., lenses, mirrors, etc.). For example, one or both of the optics 912/1012/1112 can include any one of the optical element or plurality of optical elements as described above, which can be used to dynamically control illumination light 926/1026/1126 before it reaches pattern generator 904/1004/1104. This can be used to control to control one of conventional, annular, single pole, multiple pole, quasar illumination mode, or any other modes that are used for a specific application.

In one example, projection system 908/1008/1108 includes one or more optical elements (e.g., lenses, mirrors, etc.).

In various examples, pattern generator 904/1004/1104 can be a mask-based or maskless pattern generator, as would become apparent to one of ordinary skill in the art. The masked-based or maskless system can be associated with a lithography, photolithography, microlithography, immersion lithography system, flat panel display lithography.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

What is claimed is:

1. A system, comprising:
an illumination system that produces a beam of radiation, the illumination system having a pupil plane and an object plane;
at least one optical element having at least one fluid path therethrough through which the beam passes, which is capable of changing a characteristic of one or more portions of the beam, the at least one optical element being positioned at the object plane;
a fluid source that supplies fluid to the at least one fluid path; and
at least one of a pressure controller that controls a pressure of the fluid and a concentration controller that controls a concentration of the fluid to change the characteristic of the beam, which is positioned between the fluid source and the optical element,
wherein one of telecentricity or intensity uniformity of the one or more portions of the light beam are adjusted based on the optical element in conjunction with the at least one of the pressure controller and the concentration controller.

2. The system of claim 1, wherein the one or more fluid paths are formed through one of laminar flow or fluid channels.

3. The system of claim 2, wherein the fluid channels have various shaped cross-sections.

4. The system of claim 2, wherein the fluid channels have one of constant or varying thicknesses along their length in a fluid path direction.

5. The system of claim 1, comprising:
first and second ones of the optical elements positioned one of adjacent or sequential with respect to each other, wherein the fluid flow paths in respective ones of the first and second ones of the optical element are one of parallel, perpendicular, or angled with respect to each other.

6. The system of claim 1, wherein:
the at least one of the pressure controller and the concentration controller is the concentration controller; and
the concentration controller is a mass flow controller that controls a concentration of the fluid, wherein one or both of the pressure and the concentration of the fluid are controlled to adjust the characteristic of the beam.

7. The system of claim 1, wherein a known profile of the beam is received at the pressure or concentration, respectively, controller and is used to control the pressure or concentration, respectively, of the fluid.

8. The system of claim 1, further comprising:
a detector positioned after the optical element that detects the beam and transmits a signal to the pressure controller or concentration controller, which is used to control the pressure or concentration, respectively, of the fluid.

9. The system of claim 1, further comprising:
a patterning device that patterns the beam after it has passed through the optical element; and
a projection system that projects the patterned beam onto a target portion of one of a semiconductor wafer, a flat panel display substrate, a display of a projection device, and a projector.

10. A system, comprising:
an illumination system that produces a beam of radiation, the illumination system having a pupil plane and an object plane;
at least one optical element having at least one fluid path therethrough through which the beam passes, which is capable of changing a characteristic of one or more portions of the beam, the at least one optical element being positioned at the pupil plane;
a fluid source that supplies fluid to the at least one fluid path; and
at least one of a pressure controller that controls a pressure of the fluid and a concentration controller that controls a concentration of the fluid to change the characteristic of the beam, which is positioned between the fluid source and the optical element,
wherein ellipticity of the one or more portions of the light beam is adjusted based on the optical element in conjunction with the at least one of the pressure controller and the concentration controller.

11. The system of claim 10, wherein the one or more fluid paths are formed through one of laminar flow or fluid channels.

12. The system of claim 11, wherein the fluid channels have various shaped cross-sections.

13. The system of claim 11, wherein the fluid channels have one of constant or varying thicknesses along their length in a fluid path direction.

14. The system of claim 10, comprising:
first and second ones of the optical elements positioned one of adjacent or sequential with respect to each other, wherein the fluid flow paths in respective ones of the first and second ones of the optical element are one of parallel, perpendicular, or angled with respect to each other.

15. The system of claim 10, wherein:
the at least one of the pressure controller and the concentration controller is the concentration controller; and
the concentration controller is a mass flow controller that controls a concentration of the fluid, wherein one or both of the pressure and the concentration of the fluid are controlled to adjust the characteristic of the beam.

16. The system of claim 10, wherein a known profile of the beam is received at the pressure or concentration, respectively, controller and is used to control the pressure or concentration, respectively, of the fluid.

17. The system of claim 10, further comprising:
a detector positioned after the optical element that detects the beam and transmits a signal to the pressure controller or concentration controller, which is used to control the pressure or concentration, respectively, of the fluid.

18. The system of claim 10, further comprising:
a patterning device that patterns the beam after it has passed through the optical element; and
a projection system that projects the patterned beam onto a target portion of one of a semiconductor wafer, a flat panel display substrate, a display of a projection device, and a projector.

* * * * *